United States Patent
Hara et al.

(10) Patent No.: US 10,919,711 B2
(45) Date of Patent: Feb. 16, 2021

(54) COMPONENT MOUNTING DEVICE

(71) Applicant: FUJI CORPORATION, Chiryu (JP)

(72) Inventors: Kenji Hara, Kariya (JP); Mitsuru Sanji, Toyota (JP)

(73) Assignee: FUJI CORPORATION, Chiryu (JP)

(*) Notice: Subject to any disclaimer, the term of this patent is extended or adjusted under 35 U.S.C. 154(b) by 0 days.

(21) Appl. No.: 16/481,638

(22) PCT Filed: Jan. 31, 2017

(86) PCT No.: PCT/JP2017/003367
§ 371 (c)(1),
(2) Date: Jul. 29, 2019

(87) PCT Pub. No.: WO2018/142452
PCT Pub. Date: Aug. 9, 2018

(65) Prior Publication Data
US 2019/0344979 A1   Nov. 14, 2019

(51) Int. Cl.
*H05K 3/30*      (2006.01)
*B65G 47/91*   (2006.01)
*H05K 13/04*   (2006.01)

(52) U.S. Cl.
CPC ......... *B65G 47/91* (2013.01); *H05K 13/0406* (2018.08); *H05K 13/0409* (2018.08)

(58) Field of Classification Search
CPC .... B65G 47/91; H05K 13/04; H05K 13/0406; H05K 13/0409
See application file for complete search history.

(56) References Cited

U.S. PATENT DOCUMENTS

| | | | |
|---|---|---|---|
| 2015/0296668 A1* | 10/2015 | Kawaguchi | H05K 13/041 29/740 |
| 2016/0120081 A1* | 4/2016 | Hosaka | H05K 13/0408 700/283 |
| 2016/0286699 A1* | 9/2016 | Hara | H05K 13/0404 |

FOREIGN PATENT DOCUMENTS

| | | |
|---|---|---|
| EP | 2 925 109 A1 | 9/2015 |
| EP | 2 961 163 A1 | 2/2016 |
| WO | WO 2014/080472 A1 | 5/2014 |
| WO | WO 2016/189678 A1 | 12/2016 |

OTHER PUBLICATIONS

International Search Report dated May 16, 2017 in PCT/JP2017/003367 filed on Jan. 31, 2017.

* cited by examiner

*Primary Examiner* — Muhammad S Islam
(74) *Attorney, Agent, or Firm* — Oblon, McClelland, Maier & Neustadt, L.L.P.

(57) ABSTRACT

A component mounting device including a component mounting head that mounts a component on a board by using a first raising and lowering device and a second raising and lowering device. The second raising and lowering device causes an engaging member to engage with an engaged member of a suction nozzle, and by further advancing the engaging member causes the suction nozzle to advance against a biasing force of biasing member. Further, a control device is configured to cause the engaging member to move in the advancing direction by using the actuator of the second raising and lowering device and detect an engaging position in a vertical direction at which engaging member engages with engaged member.

7 Claims, 5 Drawing Sheets

(a)

(b)

COMPONENT MOUNTING DEVICE

TECHNICAL FIELD

The present application relates to a component mounting device that mounts components on a board.

BACKGROUND ART

A component mounting device disclosed in the patent literature below has a component mounting head including: (A) a head main body; (B) a nozzle holding tool held on the head main body in a manner capable of being raised and lowered; (C) a first raising and lowering device that raises and lowers the nozzle holding tool with respect to the head main body; (D) a suction nozzle, which picks up and holds a component, that is held by a nozzle holding tool to be raised and lowered with respect to the nozzle holding tool; and (E) a second raising and lowering device that is raised and lowered together with the nozzle holding tool by the first raising and lowering device, and that raises and lowers the suction nozzle with respect to the nozzle holding tool, wherein the nozzle holding tool is moved in an advancing direction towards a board by the first raising and lowering device, and the suction nozzle is moved in the advancing direction by the second raising and lowering device, so as to mount a component on the board.

CITATION LIST

Patent Literature

Patent literature 1
WO2014/080472A1

BRIEF SUMMARY

Problem to be Solved

However, the component mounting device of patent literature 1 leaves ample room for improvement, and by performing alternations it is possible to improve the practicability of such a component mounting device. An object of the present disclosure is to provide a highly practical component mounting device that takes account of the above circumstances.

Means for Solving the Problem

To solve the above problems, with a component of the present disclosure, a second raising and lowering device includes: (e-1) a biasing member configured to bias the suction nozzle in a retracting direction with respect to the nozzle holding tool; (e-2) an engaging member provided to be raised and lowered relative to the nozzle holding tool and the suction nozzle and configured to engage with an engaged member provided on the suction nozzle; and (e-3) an actuator configured to raise and lower the engaging member, wherein the actuator is configured to, by moving the engaging member in the advancing direction, cause the engaging member to engage with the engaged member of the suction nozzle, and further, by moving the engaging member in the advancing direction in a state with the engaging member engaged with the engaged member, cause the suction nozzle to be advanced against the biasing force of the biasing member, and the control device is provided with an engaging position detecting section configured to cause the engaging member to move in the advancing direction by using the actuator of the second raising and lowering device and detect an engaging position that is a position in a vertical direction at which the engaging member engages with the engaged member.

With the component mounting device of the present disclosure, for example, in a case in which, when performing component mounting work, the actuator of the second raising and lowering device is controlled to control the load applied to a component, by using the engaging position detecting section to detect in advance the position at which the engaging member engages with the engaged member, before performing control of the load applied to the component, it is possible to speed up operation of contacting the engaging member against the engaged member, thereby improving the cycle time. Also, with the component mounting device of the present disclosure, for example, in a case in which a suction nozzle is exchangeable with respect to the nozzle holding tool, by comparing the engaging position detected by the engaging position detecting section to a correct position, it is possible to determine whether exchange of the suction nozzle was performed correctly.

DESCRIPTION OF EMBODIMENTS

Hereinafter, embodiments of a component mounting device that is an embodiment of the present disclosure are described with reference to the drawings. It should be noted that for the present disclosure, as well as the below embodiment, embodiments with various changes based on the knowledge of someone skilled in the art are possible.

Configuration of Component Mounting Device

Figure 1:
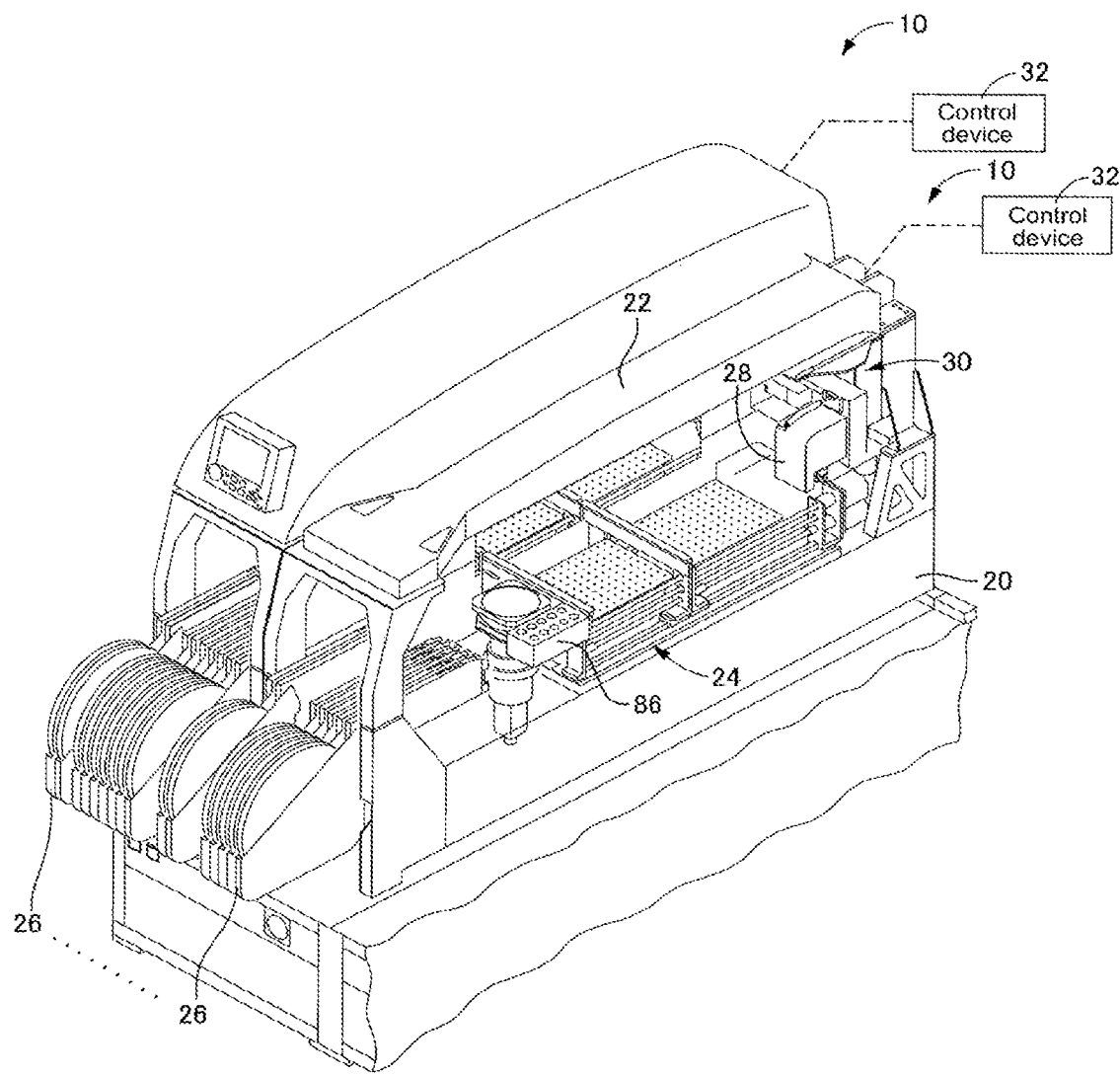
FIG. 1 is an overall view of a component mounting device that is an embodiment of the present disclosure.

FIG. 1 is a perspective view of component mounting device 10 that is an embodiment of the present disclosure. Multiple component mounting devices 10 are arranged to perform work of mounting multiple types of components onto a board. In FIG. 1, two of the multiple component mounting devices 10 are shown, and one of these is shown with external panels removed. Component mounting device 10 is provided with: base 20; beam 22 provided over base 20; board conveyor device 24 arranged on the base; multiple component feeders 26 removably attached to base 20 at a front side of component mounting device 10; removable component mounting head 28 for picking up and holding components supplied from the multiple component feeders 26 and mounting the components on a board; head moving device 30 provided on beam 22 and configured to move component mounting head 28; and control device 32 for performing control.

Figure 2:
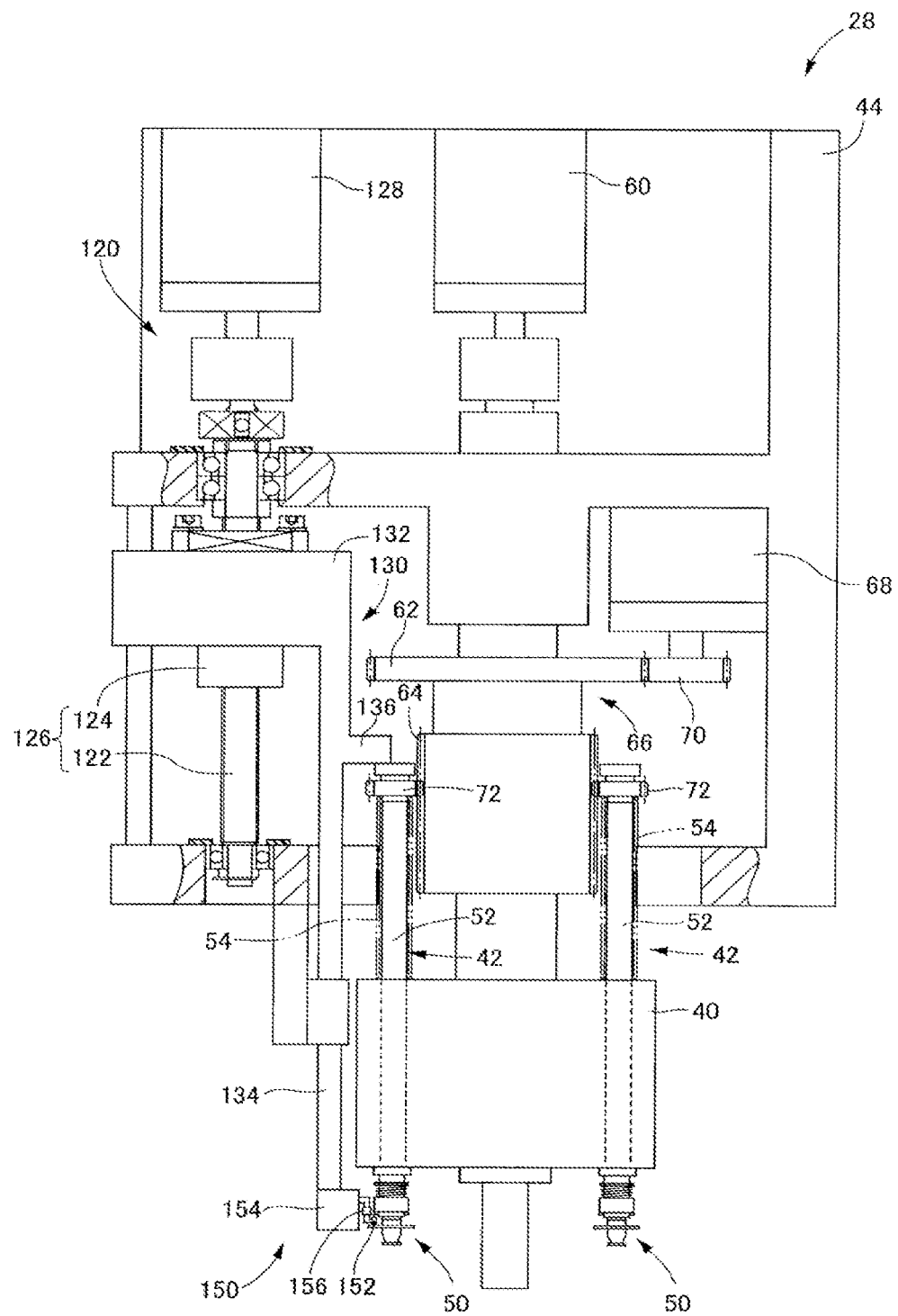
FIG. 2 is a front view of the component mounting head shown in FIG. 1.

Component mounting head 28 is described next with reference to FIG. 2. Component mounting head 28 is a rotary head that includes revolver 40 that rotates around a rotation axis, and multiple nozzle units 42 held on revolver 40. Revolver 40 is rotatably attached to head main unit 44 of component mounting head 28. Each of the multiple nozzle units 42 is configured including suction nozzle 50, and nozzle holding shaft 52 as a nozzle holding tool that extends parallel to the rotation axis of revolver 40 and that holds suction nozzle 50 at a lower end of the shaft. The multiple nozzle units 42 are arranged in a circle around the rotation axis of revolver 40 spaced out at a uniform angular pitch. Further, each nozzle unit 42 is held to be able to move in a direction of its own axis, that is, a vertical direction, and to be able to rotate. Note that, although not shown, in the present component mounting device 10, there are six nozzle units 42 held on revolver 40.

Note that, each nozzle unit 42 is biased upwards by a compression coil spring provided between a lower surface of the top end of nozzle unit 42 and an upper surface of revolver 40 so as to be normally positioned in a raised position.

Revolver 40 is rotated by revolver rotating motor 60 that is an electric motor provided co-axially. Also, rotation body 66 provided with two gears, 62 and 64, is rotatably provided coaxially with revolver 40. Pinion 70 fixed to an output shaft of nozzle rotating motor 68 is engaged with gear 62, and pinion 72 formed at an upper end of each nozzle holding shaft 52 is engaged with gear 64. Accordingly, rotating body 66 rotates when pinion 70 is rotated by nozzle rotating motor 68, and each of the multiple nozzle units 42 rotates together around there respective axis lines. Note that, revolver rotating motor 60 and nozzle rotating motor 68 are motors with encoders such that rotation angle control is possible.

Figure 3:
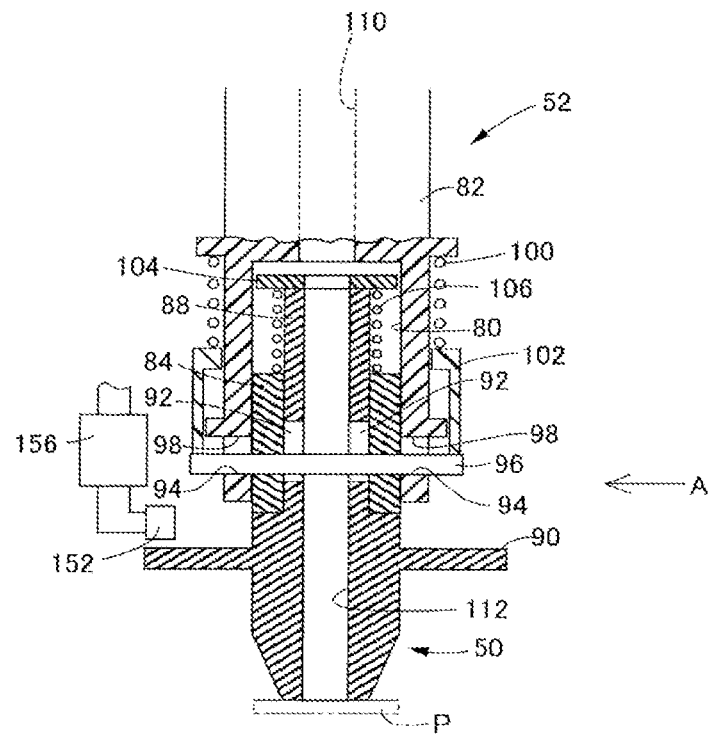
FIG. 3 shows a suction nozzle of a nozzle unit moved up and down by the raising and lowering device shown in FIG. 2, with FIG. 3($a$) showing a partial cross section, and FIG. 3($b$) showing a view from A.
Figure 3:
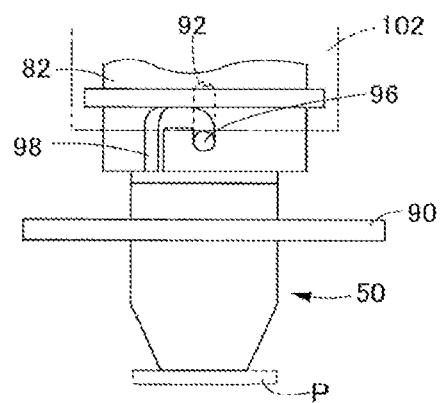

Nozzle holding shaft 52 of each nozzle unit 42, as shown in FIG. 3(*a*), includes shaft main body 82 provided with attachment hole 80 on a lower end, and tubular sleeve 84 that is removably attached to shaft main body 82. Sleeve 84 is attached to and removed from attachment hole 80 in a state in which suction nozzle 50 can be relatively moved in the shaft direction but not relatively rotated. That is, suction nozzle 50 is engaged with shaft main body 82 via sleeve 84, and sleeve 84 functions as a portion of nozzle holding shaft 52 once engagement has occurred. In other words, nozzle holding shaft 52 that is a nozzle holding tool is configured including shaft main body 82 and sleeve 84, and suction nozzle 50 and sleeve 84 are exchangeable as one to and from shaft main body 82. Note that, the suction nozzle assembly formed from suction nozzle 50 and sleeve 84 is automatically exchanged with another suction nozzle assembly stored in nozzle stocker 86 (refer to FIG. 1) during work of mounting components on a board in accordance with the component being mounted.

Suction nozzle 50 includes shaft section 88 and flange section 90, and pair of elongated holes 92 long in the vertical direction is provided at an intermediate portion of shaft section 88. On the other hand, pair of elongated holes 94 are positioned in sleeve 84 facing those elongated holes 92. Pin 96 is fixed to sleeve 84 piercing through the pair of holes 74 and the pair of elongated holes 92. The ends of pin 96 extending from sleeve 84 are engaged with pair of slots 98 formed on a lower end section of shaft main body 82 of nozzle holding shaft 52.

In detail, each of the pair of slots 98, as shown in FIG. 3(*b*), extends downwards from the lower end of shaft main body 82, then bends at a right angle to extend in a circumferential direction, then hangs down vertically from an end of that portion. By the ends of pin 96 being engaged along the pair of slots 98, pin 96 is engaged with the portion of the pair of slots 98 hanging down. In this state, pin 96 pierces through shaft main body 82 of nozzle holding shaft 52, sleeve 84, and shaft body 88 of suction nozzle 50 such that relative rotation of those three member is prohibited. That is, when nozzle holding shaft 52 is rotated, suction nozzle 50 is rotated.

Further, pin 96 is biased downwards by a lock mechanism configured from compression coil spring 100 and stopper ring 102 and is fixed to shaft main body 82 in a state engaged with the pair of slots 98. That is, sleeve 84 cannot move vertically with respect to shaft main body 82. On the other hand, suction nozzle 50, due to elongated hole 92 provided in shaft section 88, is able to move in a vertical direction with respect to sleeve 84, that is, with respect to nozzle holding shaft 52, by an amount corresponding to the length of elongated hole 92. Further, flange member 104 is fixed to an upper end of shaft section 88 of suction nozzle 50, and compression coil spring 106 as a biasing member is provided between the lower surface of flange member 104 and the upper surface of sleeve 84 such that suction nozzle 50 is biased upwards. In the state shown in FIG. 3, due to spring 106, suction nozzle 50 is positioned at an upper end limit in the range movable due to elongated hole 92 and pin 96.

Holding-shaft-side channel 110 for allowing the supply and escape of air is provided in shaft main body 82 of nozzle holding shaft 52 and passes through attachment hole 80. Further, provided on suction nozzle 50 is nozzle-side channel 112 extending along the axis line from the upper end to the lower end. That is, nozzle-side channel 112 goes through holding-shaft-side channel 110 via attachment hole 80. Further, by supplying negative pressure to the nozzle-side channel, as shown in FIG. 3, component P is picked up and held at the tip of suction nozzle 50, in which way component P is held by component mounting head 28.

Component mounting head 28 is provided with nozzle unit raising and lowering device 120 for raising and lowering one of the multiple nozzle units 42 during pickup and mounting of a component. Nozzle unit raising and lowering device 120 raises and lowers the nozzle unit 42 positioned at a specified position (set position) on the circumference on which the multiple nozzle units are arranged. Nozzle unit raising and lowering device 120 is configured mainly of screw mechanism 126 configured from screw shaft 122 and nut 124, and raising and lowering motor 128 fixed to head main body 44 and configured to rotate screw shaft 122. Raising and lowering drive member 130 is fixed to nut 124, and by the rotation of screw shaft 122 by raising and lowering motor 128, raising and lowering drive member 130 is moved in a vertical direction along with nut 124.

Raising and lowering drive member 130 includes main body section 132, arm section 134 hanging straight down from main body section 132, and engaging section 136 protruding to the side from a portion above arm section 134 and engaging with the upper end of nozzle unit 42. With nozzle unit raising and lowering device 120, by the lowering of raising and lowering drive member 130 by raising and lowering motor 128, engaging section 136 contacts an upper end of nozzle unit 42 positioned at the set position, and in that state, against the biasing force of compression spring 54, that nozzle unit 42 is lowered. From a configuration as described above, in component mounting device 10, the raising and lowering device that raises and lowers nozzle holding shaft 52 as a nozzle holding tool is configured from nozzle unit raising and lowering device 120 and compression coil spring 54.

Component-nozzle force adjusting device 150, which is configured to adjust component-nozzle force F that is a force applied between component P and suction nozzle 50 when component P is picked up or released by suction nozzle 50, is provided on a lower end of arm section 134 of raising and lowering drive member 130. Component-nozzle force adjusting device 150 softens the impact when suction nozzle 50 contacts component P when a component P is received from component feeder 26, and softens the impact when suction nozzle 50 contacts component P when the component P is mounted on the board. Also, component-nozzle force adjusting device 150 is used when wishing to push component P into the board with a uniform force when mounting the component P on a board.

Component-nozzle force adjusting device 150 is configured including engaging pin 152 as an engaging member held in a position above flange section 90 of suction nozzle 50, and linear motor 154 as an actuator that moves engaging pin 152 in a vertical direction with respect to raising and lowering drive member 130. Component-nozzle force adjusting device 150 lowers engaging pin 152 with respect to raising and lowering drive member 130, and by contacting engaging pin 152 against the upper surface of flange section 90 of suction nozzle 50 and further lowering engaging pin 152, suction nozzle 50 is lowered with respect to nozzle holding shaft 52. Accordingly, with component-nozzle force adjusting device 150 configured in this manner, when a component is picked up or released, by controlling the current supplied to linear motor 154, it is possible to control the pressing force of engaging pin 152 on flange section 90, that is, the pressing force of suction nozzle 50 on component P.

Note that, load cell 156 as an applied force detector that detects the force in the vertical direction on engaging pin 152 is provided on engaging pin 152. Load cell 156 detects the difference between the upwards force applied to suction nozzle 50 in accordance with the biasing by spring 106, and the upwards force applied to suction nozzle 50 by the component or by the board via the component when picking up or mounting the component P, as the applied force. Further, the upwards force applied to suction nozzle 50 can be considered a reaction force to the downwards force applied to engaging pin 150 by linear motor 154, therefore, the current supplied to linear motor 154 is controlled based on the detection results of load cell 156.

According to the above configuration, component mounting device 10 can be considered to be provided with a first raising and lowering device configured to raise and lower nozzle holding shaft 52 as a nozzle holding tool relative to head main body 44, and a second raising and lowering device configured to raising and lower suction nozzle 50 relative to nozzle holding shaft 52. As described above, the first raising and lowering device includes nozzle unit raising and lowering device 120 and compression coil spring 54. Further, the second raising and lowering device includes component-nozzle force adjusting device 150 and compression coil spring 106. To describe the second raising and lowering device in detail: the second raising and lowering device, using component-nozzle force adjusting device 150, by lowering engaging pin 152 using linear motor 154 in a state with engaging pin 152 contacting the upper surface of flange section 90 of suction nozzle 50, lowers suction nozzle 50 against the biasing force of spring 106, and the lowered suction nozzle 50 is raised by the biasing force of spring 106.

Control During Component Mounting

Figure 4:
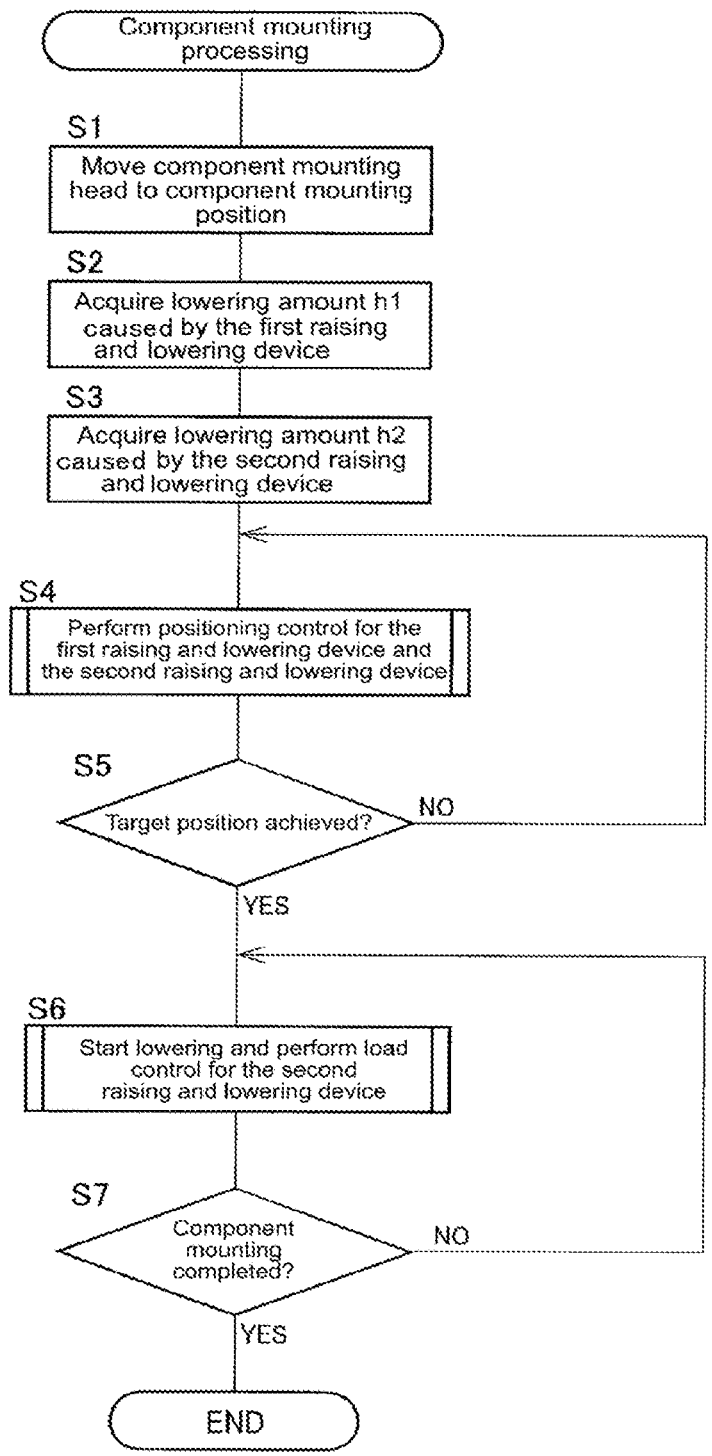
FIG. 4 is a flowchart of component mounting work performed by the control device shown in FIG. 1.

Control of component mounting device 10 is performed by control device 32. Control device 32 normally controls operation of items such as conveyor device 24, component feeders 26, component mounting head 28, and head moving device 30 when performing work to mount components on a board. With regard to component mounting work, detailed descriptions are omitted, and descriptions are given of control of the component mounting head when a component P held by component mounting head 28 is mounted on a board, with descriptions given with reference to the flowchart shown in FIG. 4.

First, component mounting head 28 is positioned by head moving device 30 at a component mounting position above the board held by conveyor device 24 (step 1, hereinafter also referred to as "S1", with the same notation applied to other steps). Upon component mounting head 28 being moved to the component mounting position, nozzle unit 42 starts to be lowered by nozzle unit raising and lowering device 120 of the first raising and lowering device (S4). Further, at the same time as nozzle unit 42 being lowered by the first raising and lowering device, lowering of engaging pin 152 by linear motor 154 is started using component-nozzle force adjusting device 150 of the second raising and lowering device (S4).

Figure 5:
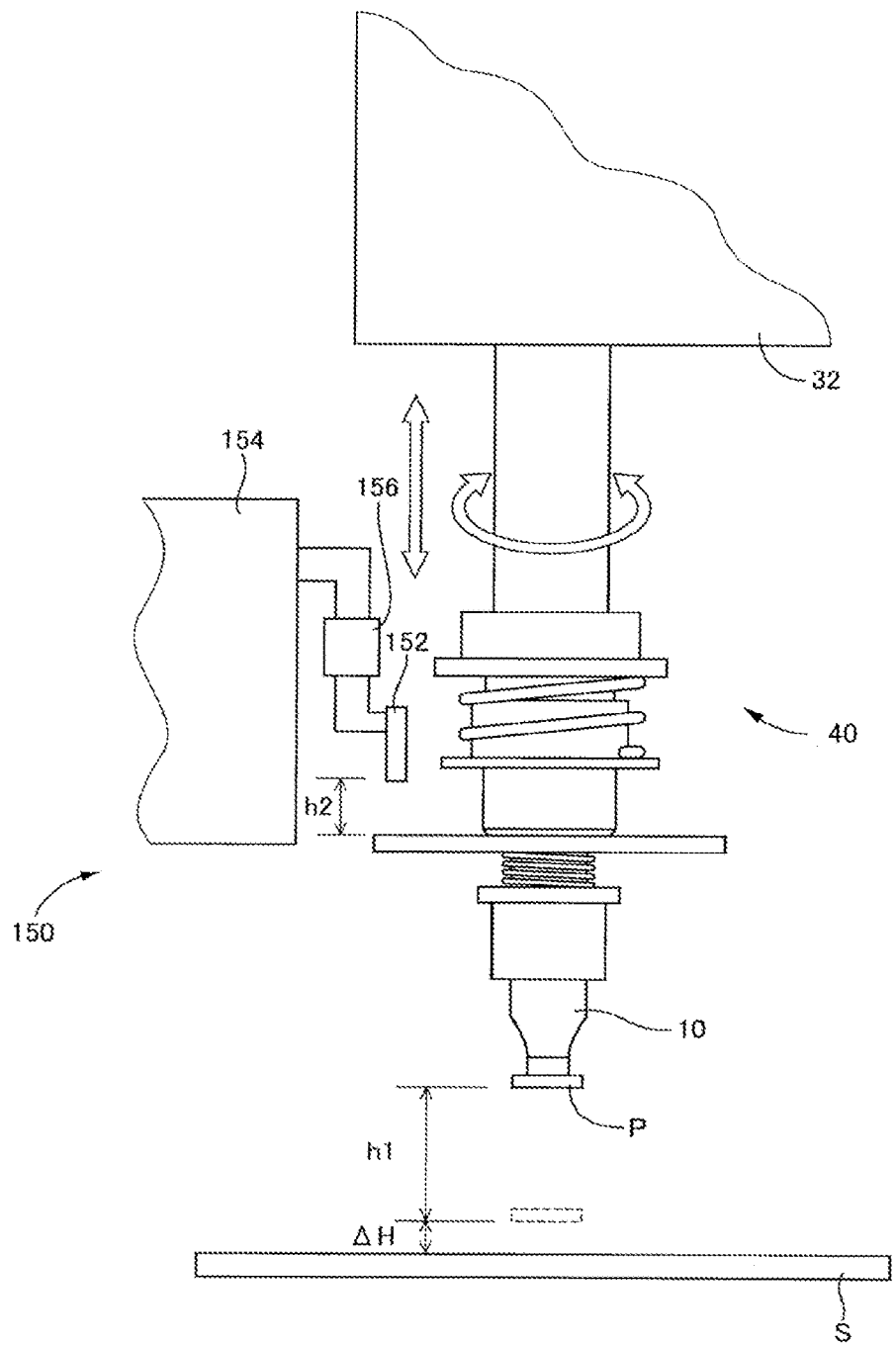
FIG. 5 illustrates operation of the component mounting head during component mounting in the embodiment of the component mounting device.

Note that, as shown in FIG. 5, nozzle unit 42 is lowered by nozzle unit raising and lowering device 120 to a position at which the difference between the lower surface of component P held by component mounting head 28 and the upper surface of board S at the mounting position of the component P is predetermined height difference ΔH (S5). Also, engaging pin 152 is lowered to contact flange section 90 of suction nozzle 50 (S5). Note that, lowering amount h1 of nozzle unit 42 and lowering amount h2 of engaging pin 152 are calculated in advance (S2, S3), and lowering is performed at a relatively fast speed to arrive quickly at the respective target positions.

As well as nozzle unit 42 being lowered to the target position, when engaging pin 152 contacts flange section 90 of suction nozzle 50, using component-nozzle force adjusting device 150 of the second raising and lowering device, by further lowering engaging pin 152 using linear motor 154, suction nozzle 50 is lowered with respect to nozzle holding shaft 52 (S6). Note that, the speed at which suction nozzle 50 is lowered, that is, the speed at which engaging pin 152 is lowered, is slower than the speed used to contact flange section 90 of suction nozzle 50, which means that lowering is performed at a relatively slow speed.

Further, by lowering suction nozzle 50 with respect to nozzle holding shaft 52, component P is pressed into board S, but with component mounting device 10, as described above, when pressing component P into board S using component-nozzle force adjusting device 150, the load applied to component P is controlled (S6).

That is, when mounting a component, until the component contacts the board, suction nozzle should be lowered with respect to nozzle holding shaft 52 while compressing spring 106, and the current gradually increased to linear motor 154. Further, contact of the component on the board is detected 156 based on the change in the applied force detected by load cell 156, and from that point control is changed to feedback control for maintaining a target applied force such that the component is pressed into the board with a set force (set pressing force). Upon contact, a large force is applied to the component, thus, to decrease the force applied to the component, the current supplied to linear motor 154 is decreased via feedback control. As a result, the force due to linear motor 154 is reduced, which achieves a cushioning effect.

In a case in which the responsiveness of the feedback control is poor, the force applied to the component upon contact is large. With component mounting device 10, high frequency control is possible, so as soon as contact of the component on the board is detected, control device 32 can control the current supplied to linear motor 154 such that the counterforce is equal to the set pressing force. As a result, the change in the counterforce can be curtailed to be small, and damage to the component P due to the impact during contact can be largely curtailed.

The force with which linear motor 154 causes suction nozzle 150 to be lowered, that is, the force generated by linear motor 154, can be considered the force applied to suction nozzle 50 from spring 106 or the counterforce applied to suction nozzle 50 from the board via the component, which is generally dependent on the current that is actually supplied to linear motor 154. Accordingly, by monitoring the current actually supplied to linear motor 154 it is possible to monitor the force generated by linear motor 154, that is, the force applied to suction nozzle 50. Using this, by performing feedback control based on the actual supplied current such that linear motor 154 generates a target application force that is a target force to be applied to suction nozzle 50 by linear motor 154, it is possible to perform the control described above. When performing such control, the current detector that detects the current actual flowing may function as the applied force detector instead of load cell 156.

Calibration Before Component Mounting Work

In each of the multiple nozzle units 42, there is variance in the height of flange section 90 of suction nozzle 50. Further, when performing component mounting work, from the point of view of shortening the cycle time, it is desirable for engaging pin 152 to be reliably contacted against flange section 90 of suction nozzle 50. Thus, in component mounting device 10, before performing component mounting work, as calibration, measurement is performed of lowering amount h2 of engaging pin 152 in order for engaging pin 152 to contact flange section 90.

In this calibration, first, current is applied to linear motor 154 of component-nozzle force adjusting device 150, and engaging pin 152 is lowered at a relatively slow speed with respect to the nozzle unit 42 positioned corresponding to nozzle unit raising and lowering device 120. Control device 32 monitors the applied force detected by load cell 156, and when the applied force increases rapidly, it is determined that engaging pin 152 has contacted flange section 90.

Control device 32, with respect to the measured nozzle unit 42 of the multiple nozzle units 42, memorizes lowering amount h2 of engaging pin 152 until the engaging pin 152 contacted flange section 90, that is, memorizes the stroke of linear motor 154. Then, control device 32, by rotating revolver 40, consecutively measures and memorizes lowering amount h2 of the engaging pin 152 for each of the multiple nozzle units 42 held by revolver 40.

Note that, in a case in which lowering amount h2 of engaging pin 152 is outside a tolerance range based on design values, this indicates that the nozzle assembly may not be attached correctly to nozzle holding shaft 52, thus a warning is issued. In particular, if the lowering amount of engaging pin 152 is outside the tolerance range by a large amount, it is determined that the nozzle assembly is not being held by nozzle holding shaft 52. In other words, component mounting device 10 is configured to measure lowering amount h2 of engaging pin 152 to be used for actual mounting work and to check the attachment state of the nozzle assembly at the same time.

Further, component mounting device 10, as described above, automatically exchanges the nozzle assembly for another nozzle assembly, so, after performing exchange, component mounting device 10 measures lowering amount h2 of engaging pin 152 and checks the attachment state of the nozzle assembly for the nozzle unit 42 for which the nozzle assembly was exchanged.

During component mounting work, it is conventional to lower a component towards the board at a relatively slow speed immediately before mounting the component on the board, so as to decrease the load when the component contacts the board. However, according to component mounting device 10 as described above, by measuring lowering amount h1 of nozzle unit 42 and lowering amount h2 by which engaging pin 152 is lowered to contact flange section 90 of suction nozzle 50 before performing component mounting work, it is possible to move the component close to the board at a relatively fast speed, which means that the cycle time of the component mounting work is improved.

REFERENCE SIGNS LIST

10: component mounting device;
28: component mounting head;
32: control device;
42: nozzle unit;
44: head main body;
50: suction nozzle;
52: nozzle holding shaft (nozzle holding tool);
54: compression coil spring (first raising and lowering device);
84: sleeve (nozzle holding tool);
90: flange section (engaged section);
86: nozzle stocker;
106: compression coil spring (biasing member, second raising and lowering device);
120: nozzle unit raising and lowering device (first raising and lowering device);
150: component-nozzle pressure adjusting device (second raising and lowering device);
152: engaging pin (engaging member);
154: linear motor (actuator);
156: load cell (applied force detector)

The invention claimed is:

1. A component mounting device comprising:
a component mounting head including
(A) a head main body,
(B) a nozzle holding tool held on the head main body,
(C) a first raising and lowering device configured to raise and lower the nozzle holding tool with respect to the head main body in an advancing direction towards a board,
(D) a suction nozzle, which picks up and holds a component, that is held by the nozzle holding tool to be raised and lowered relative to the nozzle holding tool, and
(E) a second raising and lowering device that is configured to be raised and lowered together with the nozzle holding tool by the first raising and lowering device, and that is configured to raise and lower the suction nozzle relative to the nozzle holding tool, and the suction nozzle is moved in the advancing direction by the second raising and lowering device, so as to mount the component on the board, the second raising and lowering device including
a biasing member configured to bias the suction nozzle in a retracting direction with respect to the nozzle holding tool, an engaging member provided to be raised and lowered relative to the nozzle holding tool and the suction nozzle and configured to engage with an engaged member provided on the suction nozzle, and an actuator configured to raise and lower the engaging member, the actuator configured to, by moving the engaging member in the advancing direction, cause the engaging member to engage with the engaged member of the suction nozzle, and further, by moving the engaging member in the advancing direction in a state with the engaging member engaged with the engaged member, cause the suction nozzle to be advanced against the biasing force of the biasing member; and a control device configured to control operation of the component mounting head, the control device including an engaging position detecting section configured to cause the engaging member to move in the advancing direction by using the actuator of the second raising and lowering device at a speed slower than that of the first raising and lowering device and when an applied force applied in a vertical direction to the engaging member increases at a predetermined rate the control device determines an engaging position that is a position in vertical direction at which the engaging member engages with the engaged member and the control device memorizes a lowering amount of the second raising and lowering device that corresponds to the suction nozzle held by the nozzle holding tool.

2. The component mounting device according to claim 1, further comprising:

an applied force detector configured to detect the applied force applied in the vertical direction to the engaging member, wherein the control device is configured to, when mounting the component, by controlling a force applied between the engaging member and the suction nozzle due to the actuator of the second raising and lowering device based on the applied force detected by the applied force detector, control a load that is applied to the component, and the engaging position detecting section is configured to detect that the engaging member has engaged with the engaged member of the suction nozzle based on a change in the applied force detected by the applied force detector.

3. The component mounting device according to claim 1, wherein the component mounting head is configured to allow the suction nozzles to be exchanged with respect to the nozzle holding tool, and the control device is configured to determine whether exchange of the suction nozzle has been performed correctly based on the engaging position detected by the engaging position detecting section.

4. The component mounting device according to claim 2, wherein the control device is configured to, before performing control of the load applied to the component, control the actuator based on the engaging position detected by the engaging position detecting section, such that the engaging member is moved to a position at which the engaging member engages with the engaged member of the suction nozzle.

5. The component mounting device according to claim 4, wherein the control device is configured to, at the same time as the nozzle holding tool is raised or lowered by the first raising and lowering device, move the engaging member to the position at which the engaging member engages with the engaged member of the suction nozzle.

6. The component mounting device according to claim 4, wherein a speed at which the engaging member is moved to the position at which the engaging member engages with the engaged member is faster than a speed at which the engaging member is moved when control of the load applied to the component is being performed.

7. The component mounting device according to claim 4, wherein the component mounting head is provided with multiple suction nozzles, and the engaging position detecting section is configured to detect and memorize the engaging position of each of the multiple suction nozzles, and the control device is configured to, when the engaging member is moved to the position at which the engaging member is engaged with the engaged member of each of the multiple suction nozzles, control the actuator based on the respective memorized engaging positions of each of the multiple suction nozzles.

* * * * *